(12) United States Patent
Callan et al.

(10) Patent No.: US 11,728,687 B2
(45) Date of Patent: Aug. 15, 2023

(54) TWO-SIDED INDUCTIVE CHARGING COIL

(71) Applicant: Microsoft Technology Licensing, LLC, Redmond, WA (US)

(72) Inventors: Casey Sean Callan, Seattle, WA (US); Stefan Jon Kristjansson, Woodinville, WA (US); Daniel Thomas Nevistic, Bellevue, WA (US); George Karavaev, Redmond, WA (US); Michael Francis Deily, Bellevue, WA (US); David William Voth, Woodinville, WA (US); Srinivas Reddy Nagampet, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 500 days.

(21) Appl. No.: 16/538,328

(22) Filed: Aug. 12, 2019

(65) Prior Publication Data

US 2021/0050742 A1 Feb. 18, 2021

(51) Int. Cl.
*H02J 50/10* (2016.01)
*H02J 50/40* (2016.01)
*H05K 3/46* (2006.01)

(52) U.S. Cl.
CPC ............ *H02J 50/402* (2020.01); *H02J 50/10* (2016.02); *H05K 3/4691* (2013.01); *H05K 2201/0707* (2013.01)

(58) Field of Classification Search
CPC ............ H02J 50/12; H02J 50/90; H02J 50/50; H02J 50/70; H02J 50/60; H02J 50/80; H02J 7/00304; H02J 7/0042; H02J 7/0013; H02J 50/005; H02J 7/00308; H02J 7/00302; H02J 50/00; H02J 50/40; H02J 7/00; H02J 7/0047; H02J 2310/23; H02J 7/00034; H02J 7/0044; H02J 2310/48; H02J 50/402; H02J 50/20; H02J 50/23; H02J 2310/40; H02J 50/502; H02J 7/0029; H02J 7/00309;
(Continued)

(56) References Cited

U.S. PATENT DOCUMENTS 9,112,363 B2  8/2015  Partovi
9,178,378 B2  11/2015  Yoon
(Continued)

OTHER PUBLICATIONS

"Coils Used for Wireless Charging", Retrieved from: https://www.nxp.com/docs/en/application-note/AN4866.pdf, Jan. 2014, 07 Pages.
"International Search Report and Written Opinion Issued in PCT Application No. PCT/US2020/038569", dated Aug. 12, 2020, 10 Pages.

*Primary Examiner* — Binh C Tat
(74) *Attorney, Agent, or Firm* — Ray Quinney & Nebeker P.C.; John O. Carpenter

(57) ABSTRACT

A device for inductively charging an electronic accessory includes a first portion, a second portion, and a spacer. The first portion includes a first transmission coil in a first plane where the first transmission coil is configured to generate a first magnetic field, and the second portion includes a first transmission coil in a second plane where the second transmission coil is configured to generate a second magnetic field. The spacer is positioned between the first transmission coil and the second transmission coil and between the first plane and the second plane. The spacer material magnetically insulates the second transmission coil from the first magnetic field.

13 Claims, 7 Drawing Sheets

(58) Field of Classification Search
CPC ............... H02J 7/007194; H02J 7/0019; H02J 7/0027; H02J 7/02; H02J 7/025; H02J 7/35; H02J 50/10; H02J 50/05; H02J 7/00045; H02J 7/007182; H02J 7/04; H02J 2300/28; H02J 7/34; H02J 50/30; H02J 50/001; H02J 7/0048; H02J 50/15; H02J 50/27; H02J 7/0045; H02J 7/00714; H02J 3/322; H02J 2207/40; H02J 2300/24; H02J 7/00036; H02J 7/00718; H01F 38/14; H01F 27/366; H01F 27/36; H01F 27/361; H01F 27/363; H01F 27/288; H01F 6/06; H01F 27/2823; H01F 7/0221; H01F 27/325; H01F 5/003; H01F 2003/005; H04B 5/0093; H04B 5/0087; H04B 5/00; H04B 5/0075; H04B 17/309; H03H 7/40; H03H 2001/0057

USPC .................................................. 320/106–115
See application file for complete search history.

(56) References Cited

U.S. PATENT DOCUMENTS

| | | | |
|---|---|---|---|
| 9,231,411 | B2 | 1/2016 | Baarman et al. |
| 9,595,383 | B2 | 3/2017 | Chien et al. |
| 9,698,632 | B2 | 7/2017 | Davison et al. |
| 2012/0153738 | A1* | 6/2012 | Karalis ................... B60L 53/52 |
| | | | 307/104 |
| 2015/0091388 | A1* | 4/2015 | Golko ...................... H02J 50/70 |
| | | | 307/104 |
| 2015/0279556 | A1* | 10/2015 | Chiyo ...................... H02J 7/025 |
| | | | 307/104 |
| 2016/0372961 | A1 | 12/2016 | Ritter et al. |
| 2018/0090973 | A1* | 3/2018 | Jol ........................ H05K 9/0007 |
| 2019/0081515 | A1 | 3/2019 | Gajiwala et al. |

* cited by examiner

TWO-SIDED INDUCTIVE CHARGING COIL

BACKGROUND

Background and Relevant Art

Electronic devices commonly utilize wireless accessory devices to allow users to provide inputs to or interact with the electronic devices. Wireless accessory devices have batteries to power the accessory devices during operation. Conventional systems for charging the accessory devices include charging cables, inductive charging coils, or charging cradles. Each of the conventional charging systems require the user to place the accessory device in a particular location, on a particular cradle, or to take an extra step of plugging the device into a cable.

Inductive charging provides a current through transmission coil to generate a magnetic field. Exposure of a second coil of conductive material to the magnetic field induces a current through the receiving coil to wirelessly power an electronic device or charge a battery. Because the power transmission via the magnetic field is related to the strength of the magnetic field, the power transmission decreases rapidly (e.g., as a square of the distance). Efficient power transmission via a magnetic field, therefore, requires positioning the transmission coil and receiving coil as close to one another as possible.

BRIEF SUMMARY

As noted above, electronic devices commonly use wireless accessories. For example, a user may have a wireless keyboard for their computer. The user may wish to have the keyboard wirelessly charged while it is mounted or attached to the computer in multiple, different positions. In this example, the keyboard may magnetically couple to two or more different surfaces of the computer so as to facilitate use with the computer while the computer is in different orientations (e.g., a laptop orientation and a studio orientation). As noted above, the power transmission decreases rapidly with distance, therefore it is beneficial to have the charging coils near the surface of the computer and the keyboard in each charging position.

In one example, the computer includes two charging coils to facilitate charging near opposite surfaces of the computer (e.g., with one coil near each surface). Magnetic coupling between the coils in the computer (e.g., between transmission coils) could lead to power loss and potential damage to the charging circuitry. Thus, in this example, the coils are stacked with ferrite and a non-magnetic material in-between the coils to inhibit the coupling effects within the computer. These stacked coils allow for efficient charging of the keyboard while it is in both charging positions, thereby reducing the size and power requirements for the coils.

In some embodiments, a device for inductively charging an electronic accessory includes a first portion, a second portion, and a spacer. The first portion includes a first transmission coil in a first plane where the first transmission coil is configured to generate a first magnetic field, and the second portion includes a second transmission coil in a second plane where the second transmission coil is configured to generate a second magnetic field. The spacer is positioned between the first transmission coil and the second transmission coil and between the first plane and the second plane. The spacer material magnetically insulates the second transmission coil from the first magnetic field.

In some embodiments, a system for providing power to an accessory device from an electronic device includes a transmitter and a receiver. The transmitter includes a first portion, a second portion, and a spacer. The first portion includes a first transmission coil in a first plane where the first transmission coil is configured to generate a first magnetic field, and the second portion includes a first transmission coil in a second plane where the second transmission coil is configured to generate a second magnetic field. The spacer is positioned between the first transmission coil and the second transmission coil and between the first plane and the second plane. The spacer material magnetically insulates the second transmission coil from the first magnetic field. The receiver includes a first portion, a second portion, and a spacer. The first portion includes a first receiving coil where the first receiving coil is configured to generate an electrical current when exposed to a magnetic field, and the second portion includes a second receiving coil where the second receiving coil is configured to generate an electrical current when exposed to a magnetic field. The spacer is positioned between the first receiving coil and the second receiving coil. The spacer material magnetically insulates the first receiving coil and the second receiving coil.

In some embodiments, a method of providing power to an accessory device from an electronic device includes providing a first ping current to a first transmission coil proximate a first surface of the electronic device so as to generate a first magnetic field with the first transmission coil, wherein a portion of the first magnetic field extends beyond the first surface; after terminating the first ping current to the first transmission coil, providing a second ping current to a second transmission coil proximate a second surface of the electronic device opposite the first surface so as to generate a second magnetic field with the second transmission coil, wherein a portion of the second magnetic field extends beyond the second surface; detecting an induced current in a receiving coil of the accessory device in response to one of the first magnetic field and the second magnetic field; and selectively providing a charging current to the first transmission coil when the induced current is detected in response to the first magnetic field, or to the second transmission coil when the induced current is detected in response to the second magnetic field.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 1-2 is a perspective view of the accessory device of FIG. 1-1 in a second charging position with the electronic device, according to at least one embodiment of the present disclosure;

FIG. 2-1 is a cross-sectional side view of an accessory device in a first charging position with an electronic device, according to at least one embodiment of the present disclosure;

FIG. 2-2 is a perspective view of the accessory device of FIG. 2-1 in a second charging position with the electronic device, according to at least one embodiment of the present disclosure;

FIG. 5-1 is a side view of a transmitter generating a first magnetic field, according to at least one embodiment of the present disclosure;

FIG. 5-2 is a side view of a transmitter generating a second magnetic field, according to at least one embodiment of the present disclosure;

DETAILED DESCRIPTION

The present disclosure relates generally to devices, systems, and methods for providing power to an electronic accessory to power the electronic accessory and/or charge a battery of the electronic accessory wirelessly. In some embodiments, the power is provided to the electronic accessory by an electronic device, such as a laptop computer, a tablet computer, a hybrid computer, a smartphone, a smart television, other appliance, an automobile (such as in a passenger compartment of the automobile), or another electronic device. In some embodiments, providing power to the accessory device wirelessly includes positioning the accessory device in one of a plurality of positions relative to the electronic device.

Figure 1:
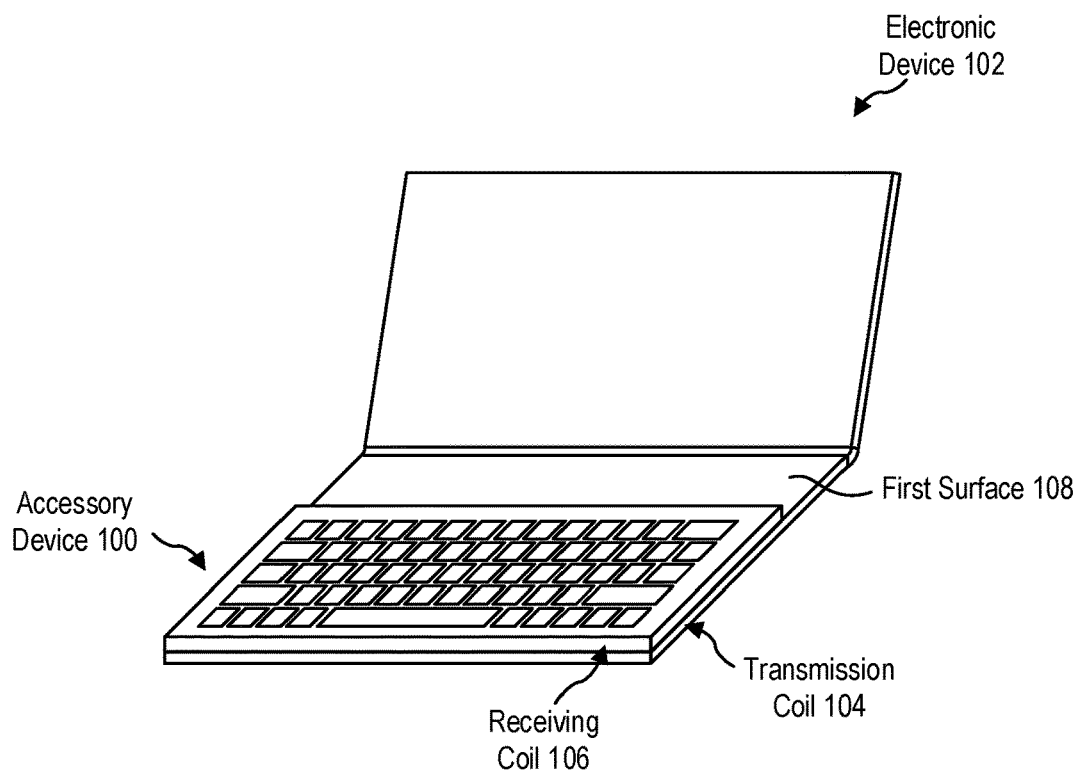
FIG. 1-1 is a perspective view of an accessory device in a first charging position with an electronic device, according to at least one embodiment of the present disclosure.

FIG. 1-1 shows a charging system 101 that includes an accessory device 100 and an electronic device 102 in accordance with some embodiments. As shown in FIG. 1-1, a user places the accessory device 100 on a first surface 108 of the electronic device 102 in a charging position. The charging position may align a transmission coil 104 of the electronic device 102 with a receiving coil 106 of the accessory device 100. When the electronic device 102 applies a charging current to the transmission coil 104 of conductive material in the electronic device, the transmission coil 104 generates a magnetic field in a normal direction relative to a plane of the coil. When the receiving coil 106 of conductive material is positioned in the magnetic field, the magnetic field induces an induced current in the receiving coil 106. The receiving coil 106 can then provide that induced current to power the accessory device 100 and/or charge a battery of the accessory device 100. In some embodiments, the accessory device 100 and the electronic device 102 utilize near field communication (NFC) protocol to charge and/or communicate via the coils 104 and 106. In some embodiments, the accessory device 100 and the electronic device 102 utilize Qi protocol to charge and/or communicate via the coils 104 and 106.

In some embodiments, the accessory device 100 blocks, obscures, or otherwise inhibits the use of a portion of the electronic device 102 when the accessory device 100 is in the charging position. In some embodiments, the electronic device 102 has a second charging position on an opposite second surface 110 of the electronic device 102, as in shown in FIG. 1-2. The user can place the accessory device 100 in the second charging position on the opposite second surface 110 to continue providing power wirelessly to the accessory device 100 without occupying the first surface 108.

In some embodiments, the electronic device 102 has a transmitter to provide magnetic fields and the accessory device 100 has a receiver to generate an induced current from the magnetic fields. A conventional inductive charging coil may use a single transmission coil in the electronic device and a receiver coil in the accessory centered within the thickness of each device.

A wireless charging system according to the present disclosure provides an advantage over the conventional design by using at least two coils in each device positioned close to the outer surfaces, thereby reducing the distance between a transmitter (Tx) and a receiver (Rx) in both the first charging position and the second charging position on the opposite surface (e.g., a upper surface of a laptop and a lower surface of a laptop). Because magnetic field power decreases rapidly with increasing distance (e.g., exponentially to an increase in distance), increasing the distance between the transmission coil and the receiving coil necessitates an associated increase in the transmission coil size and current. The reduced distance according to the present disclosure allows the wireless charging system to achieve an equal or greater rate of power transmission than the existing alternative while taking up a significantly smaller footprint in terms of length and width inside the products and consuming less power.

Figures 1, 2:
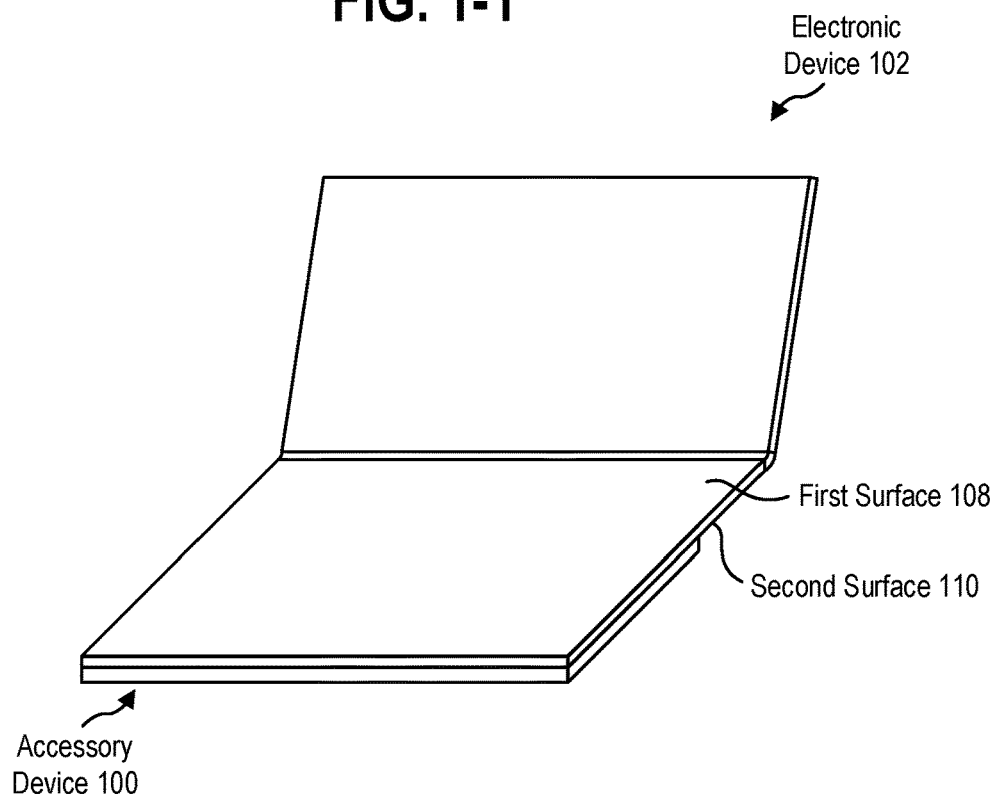
Figures 1, 2:
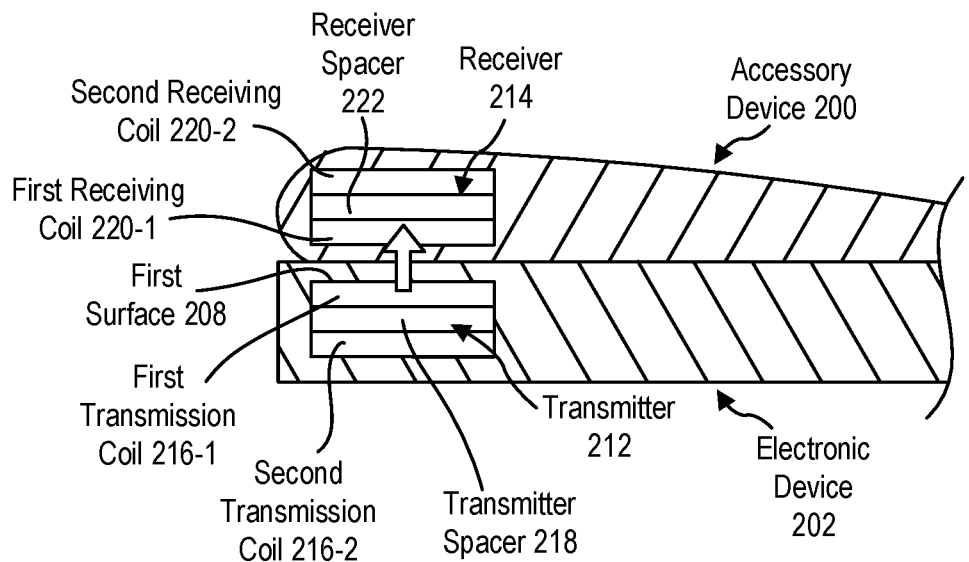
Figure 2:
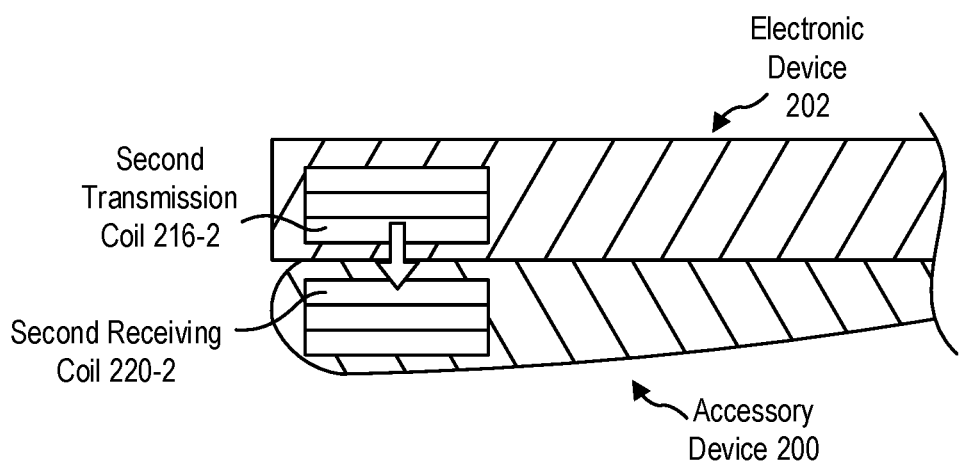

Referring now to FIG. 2-1, an accessory device 200 (e.g., the accessory device 100) is positioned on a first surface 208 of an electronic device 202 (e.g., the electronic device 102) in accordance with some embodiments. The electronic device 202 contains a transmitter 212 and the accessory device 200 contains a receiver 214. The transmitter 212 has a first transmission coil 216-1 and a second transmission coil 216-2 that are magnetically insulated from one another by a transmitter spacer 218. The receiver 214 has a first receiver coil 220-1 and a second receiver coil 220-2 that are magnetically insulated from one another by a receiver spacer 222.

In FIG. 2-1, the first transmission coil 216-1 is active and generating a magnetic field to transmit power to the first receiving coil 220-1 proximate the first transmission coil 216-1. In FIG. 2-2, the accessory device 200 is positioned in the second charging position on a second surface 210 of the electronic device 202 in accordance with some embodiments. The second transmission coil 216-2 is active and generating a magnetic field to transmit power to the second receiving coil 220-2 proximate the second transmission coil 216-2.

In some embodiments, a wireless charging system includes of a set of two transmission coils and two receiving coils contained within flexible printed circuit boards (FPCs) which are folded around other mechanical parts so as to create a stack that positions the transmission and receiving coils close to the front and back surfaces of the devices in which they are contained, respectively. The mechanical parts used in the stack include adhesives and magnetic field insulating layers. In some embodiments, a wireless charging system includes of a set of two transmission coils and two receiving coils where at least one of the coils is a discrete coiled wire or wires (e.g., Litz wire). In some embodiments, a discrete wire allows additional coil designs or geometries beyond a flat coil design of an FPC.

Figure 3:
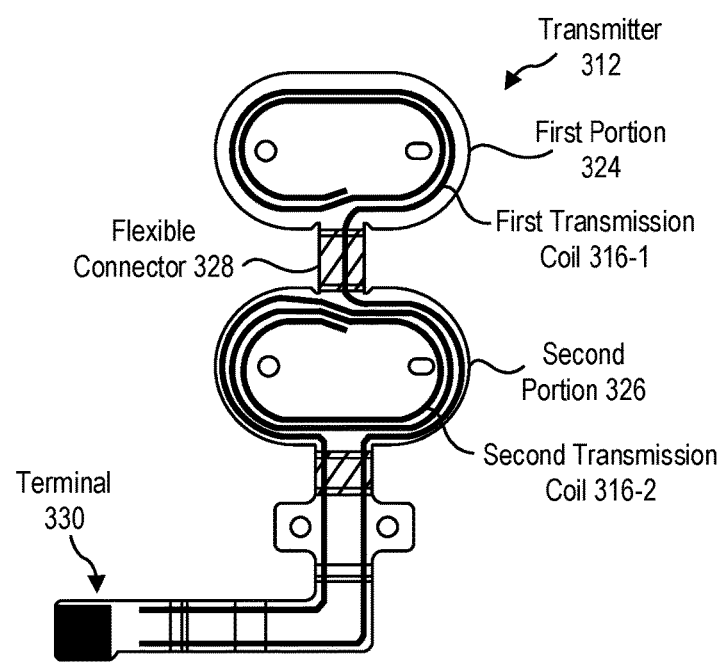
FIG. 3 is a flat view of a flexible printed circuit of a transmitter, according to at least one embodiment of the present disclosure.

FIG. 3 illustrates a flat view of a transmitter 312 (e.g., an FPC transmitter) in accordance with some embodiments. The transmitter 312 (e.g., the transmitter 212) includes the first transmission coil 316-1 positioned in the first portion 324 of the FPC and the second transmission coil 316-2 positioned in the second portion 326 of the FPC. The first portion 324 and second portion 326 are connected by a flexible connector 328. Both the first transmission coil 316-1 and second transmission coil 316-2 are in electrical communication with a terminal 330 with electrical connections for each coil, allowing individual activation of each coil through the terminal 330. The first transmission coil 316-1 is connected to the terminal 330 through the flexible connector 328.

In some embodiments, the transmitter 312 includes an alignment aperture adjacent to the coils 316. In some embodiments, the device (e.g., electronic device 102) includes an alignment peg configured to align the transmitter 312 to the electronic device 102 via the alignment aperture. In some embodiments, the electronic device 102 includes one or more magnetic alignment features, as described below with reference to FIG. 8. In some embodiments, the alignment peg and the alignment aperture are configured to align the coils 316 with the magnetic alignment features such that an accessory coupled to the magnetic alignment features has its receiver coil in close proximity to (e.g., aligned with) the corresponding transmission coil. In some embodiments, the alignment aperture is connected to the transmission coils 316, rather than another portion of the transmitter 312 (such as the spacer 318) so as to minimize alignment mismatch between the magnetic alignment features and the coils 316.

In some embodiments, a charging system (e.g., the charging system 101) includes an accessory device (e.g., the accessory device 100) and an electronic device (e.g., the electronic device 102). The electronic device may be a laptop computer, a tablet computer, a hybrid computer, a smartphone, a smart television, other appliance, an automobile (such as in a passenger compartment of the automobile), or another electronic device. For example, the electronic device may be a laptop with a first portion and a second portion that are movable by a hinge. The first portion may contain a display and the second portion has at least one user input device, such as a keyboard or a touch-sensitive surface like a pressure-sensing or capacitance-sensing surface.

The accessory device may be any accessory device that is powered by electricity. In some embodiments, the accessory device is a device for use with the electronic device, such as a Bluetooth-enabled accessory that is in data communication with the electronic device. In non-limiting examples, the accessory device can be a user input device, such as a keyboard, a mouse, a touchpad, a trackball, a stylus, a presentation remote, a pointer, a gamepad, or other device that is used to interact with and/or provide inputs to the electronic device via a data connection. In a specific example, the electronic device is a laptop and the accessory device is a keyboard. In other examples, the accessory device is an audio and/or video output device in data communication with the electronic device. In another specific example, the electronic device is a smart television and the accessory device is an audio output device such as a Bluetooth-enabled speaker or headset.

In some embodiments, the accessory device is a device that operates independently from the electronic device. For example, the accessory device is a tablet computer, a hybrid computer, a smartphone, a smartwatch, a head-mounted display, another wearable device, headphones, earphones, or other devices that may function independently from the electronic device. In a specific example, the electronic device is a hybrid computer and the accessory device is a smartphone.

In some embodiments, the accessory device is chargeable from the electronic device in a first charging position and a second charging position. The first charging position is on a first surface of the electronic device and the second charging position is on an opposite second surface of the electronic device. The accessory device can receive power from the electronic device in the first charging position or the second charging position.

In some embodiments, the charging power received by the accessory device (e.g., the induced current in the receiver) is the same whether the accessory device is in the first charging position or the second charging position. In some embodiments, the charging power received by the accessory device varies whether the accessory device is in the first charging position or the second charging position. The charging power can vary depending on a distance between the transmission coil and the receiving coil, the charging current applied to the transmission coil, the size of the transmission coil, the material of the transmission coil, the size of the receiving coil, the material of the receiving coil, the in-plane alignment of the transmission coil and the receiving coil, the angular orientation of the transmission coil and the receiving coil, and other variables.

In some examples, the first charging position induces a greater induced current in the accessory device because the housing of the electronic device is thinner proximate the first surface of the electronic device than proximate the second surface of the electronic device, such that the distance between the powered transmission coil and the receiving coil is smaller in the first charging position than the second charging position. In other examples, the first charging position induces a greater induced current in the accessory device because the powered transmission coil proximate the first surface is larger than the transmission coil proximate the second surface, such that the magnetic field produced by the transmission coil proximate the first charging position is larger than the transmission coil proximate the second charging position.

Figure 4:
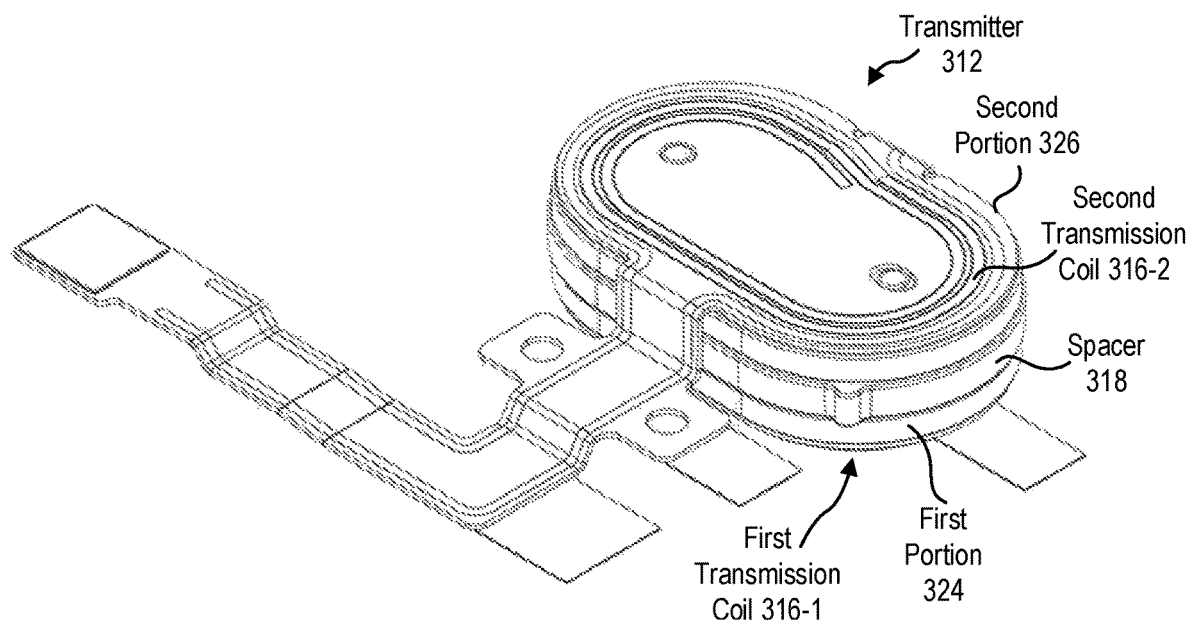
FIG. 4 is a perspective view of an assemble transmitter, according to at least one embodiment of the present disclosure.

FIG. 4 is a perspective view of the assembled FPC transmitter 312 of FIG. 3 in accordance with some embodiments. The transmitter 312 includes the first transmission coil 316-1 and second transmission coil 316-2 with a transmitter spacer 318 therebetween. The spacer 318 is sandwiched between the first portion 324 of the FPC and the second portion 326 of the FPC. In some embodiments, the transmission coils 316-1, 316-2 of the transmitter 312 are spaced apart from one another to position each of the transmission coils 316-1, 316-2 close to the opposing surfaces of the electronic device housing. Similarly, in some embodiments, the receiving coils of the receiver are spaced apart from one another to position each of the receiving coils close to the opposing surfaces of the accessory device housing.

Because the charging power provided to the receiver is related to the proximity of the transmission coil, in some embodiments, only one of the transmission coils 316-1, 316-2 is powered by a charging current at any given time. Powering only one transmission coil 316-1, 316-2 can reduce power consumption and provide more efficient power transmission. A transmitter spacer 318 positioned between the first transmission coil 316-1 and the second transmission coil 316-2 magnetically insulates the first transmission coil 316-1 and the second transmission coil 316-2 from one another.

Figures 1, 5:
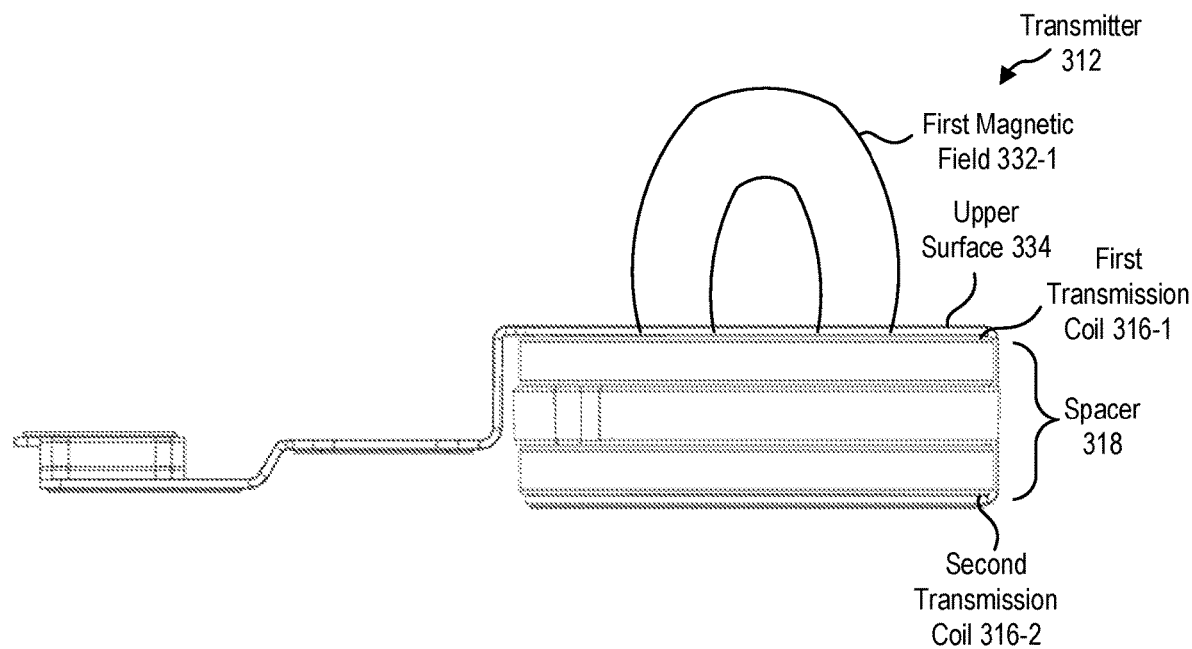
Figures 2, 5:
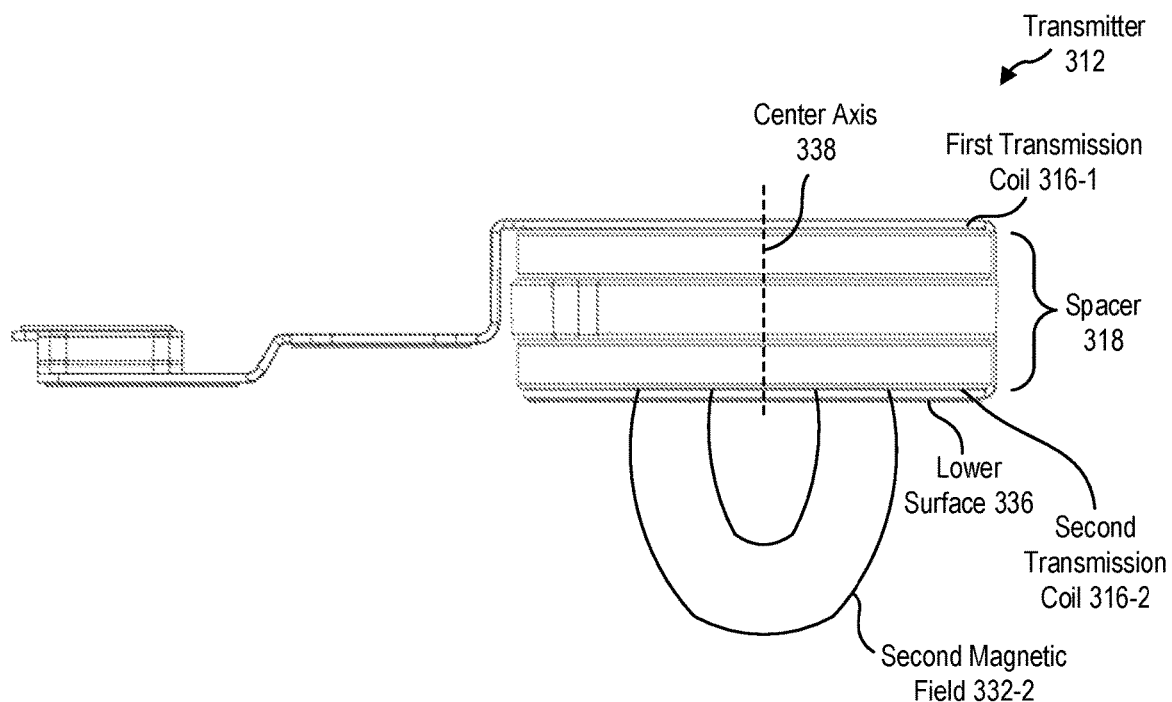

FIG. 5-1 and FIG. 5-2 are side views of the transmitter 312 of FIG. 3 and FIG. 4 in accordance with some embodiments. FIG. 5-1 illustrates a first magnetic field 332-1 produced by the first transmission coil 316-1. The first magnetic field 332-1 extends from the upper surface 334 of the transmitter 312. While the first magnetic field 332-1 also extends in the opposite direction toward the spacer 318, the magnetically insulating and/or shielding material of the spacer 318 cancels the portion of the first magnetic field 332-1 in the direction of the spacer 318. In this way, the first magnetic field 332-1 does not affect the second transmission coil 316-2.

FIG. 5-2 illustrates a second magnetic field 332-2 produced by the first transmission coil 316-1. The second magnetic field 332-2 extends from the lower surface 336 of the transmitter 312. While the second magnetic field 332-2 also extends in the opposite direction toward the spacer 318, the magnetically insulating and/or shielding material of the spacer 318 cancels the portion of the second magnetic field 332-2 in the direction of the spacer 318. In this way, the second magnetic field 332-2 does not affect the first transmission coil 316-1.

In some embodiments, the spacer 318 includes a magnetic shielding material that limits or prevents the magnetic coupling of the first transmission coil 316-1 and the second transmission coil 316-2 when one is powered. In some embodiments, the spacer 318 includes an electrically conductive material. In some embodiments, the spacer 318 includes a magnetic material. In some embodiments, the spacer 318 includes a ferromagnetic material. In one example, the spacer 318 includes ferrite. In another example, the spacer 318 includes ferrite and zinc to further prevent magnetic flux (extending, leaking) beyond the ferrite or magnetic material. The charge carrier particles in the conductive material can move in the presence of the magnetic field and thereby cancel out the magnetic field.

In some embodiments, a spacer is positioned in the receiver to space the first receiving coil and second receiving coil apart from one another. The spacer can include a magnetic shielding material that limits or prevents the magnetic coupling of the first receiving coil and the second receiving coil when one is exposed to a magnetic field from one side. In some embodiments, the spacer includes an electrically conductive material. In some embodiments, the spacer includes a magnetic material. In some embodiments, the spacer includes a ferromagnetic material. In at least one embodiment, the spacer includes ferrite. In at least one embodiment, the spacer includes zinc.

In some embodiments, in one, or both, of the transmitter and the receiver, the coils are printed on a single FPC. For example, the first transmission coil and second transmission are printed on a single FPC. In another example, the first receiver coil and second receiver coil are printed on a single FPC. In some embodiments, the coils are supported by a flexible connector such that the two coils and a terminal are all printed on a single FPC, which can be folded upon itself to produce a "stacked" set of coils.

While each transmission coil 316-1, 316-2 produces a magnetic field extending away from the transmission coil in a direction normal to the plane of the coils, the spacer 318 positioned between the two transmission coils 316-1, 316-2 attenuates or stops the magnetic field 332-1, 332-2 in the direction of the spacer 318. For example, the magnetic field produced by an upper transmission coil extends upward from the upper transmission coil and the spacer shields the lower transmission coil (and other electronics or objects) from the associated downward portion of the magnetic field. In another example, the magnetic field produced by the lower transmission coil extends downward from the upper transmission coil and the spacer shields the upper transmission coil (and other electronics or objects) from the associated upward portion of the magnetic field.

In some embodiments, the first transmission coil 316-1 and second transmission coil 316-2 are aligned with one another. In some embodiments, the first transmission coil 316-1 and second transmission coil 316-2 are positioned with a shared center axis 338. In some embodiments, the first transmission coil 316-1 and second transmission coil 316-2 are parallel to one another. In yet other examples, the first transmission coil 316-1 and second transmission coil 316-2 have the same area. In some embodiments, the first transmission coil 316-1 and second transmission coil 316-2 have the same area, have the same shape, and share a center axis. In at least one embodiment, the first transmission coil 316-1 and second transmission coil 316-2 have the same area, have the same shape, share a center axis, and are parallel such that the first transmission coil 316-1 and second transmission coil 316-2 are symmetrical about a mirror plane through the spacer 318. For example, when one of the transmission coils 316-1, 316-2 generates a magnetic field 332-1, 332-2, the spacer 318 shields the other transmission coil 316-1, 316-2 from the magnetic field 332-1, 332-2 to prevent magnetic coupling of the transmission coils 316-1, 316-2.

Figure 6:
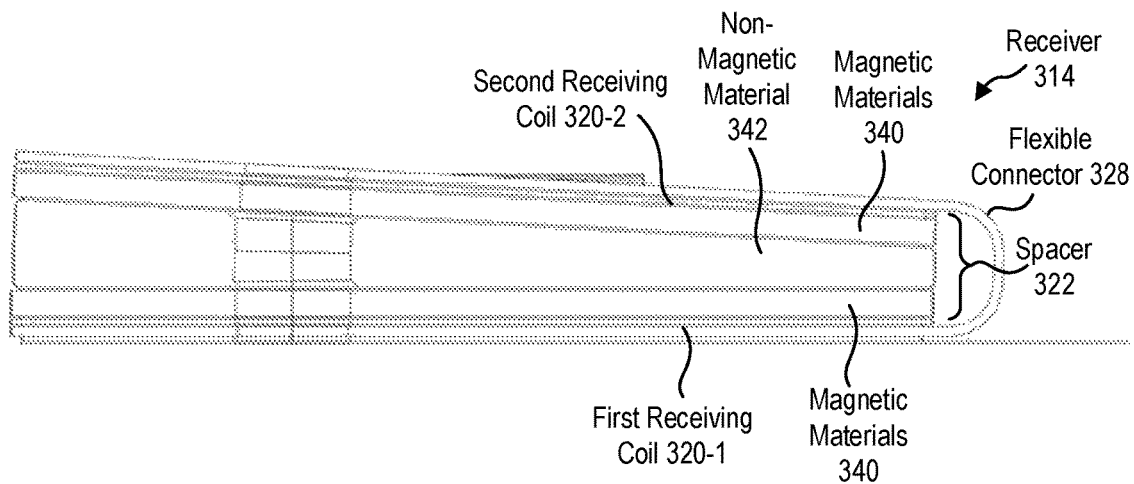
FIG. 6 is a side view of a receiver, according to at least one embodiment of the present disclosure.

FIG. 6 is a side view of a receiver 314 in accordance with some embodiments. In some embodiments, the receiver 314 includes a first receiving coil 320-1 and a second receiving coil 320-2 connected by a connector 328 that are positioned opposite one another on either side of a spacer 322. In some embodiments, the first receiving coil 320-1 and second receiving coil 320-2 are aligned with one another. In some embodiments, the first receiving coil 320-1 and second receiving coil 320-2 are positioned with a shared center axis. In some embodiments, the first receiving coil 320-1 and second receiving coil 320-2 are parallel to one another. In yet other examples, the first receiving coil 320-1 and second receiving coil 320-2 have the same area. In some embodiments, the first receiving coil 320-1 and second receiving coil 320-2 coil have the same area, have the same shape, and share a center axis. In some embodiments, the first receiving coil 320-1 and second receiving coil 320-2 have the same area, have the same shape, share a center axis, and are parallel such that the first receiving coil and second receiving coil are symmetrical about a mirror plane through the spacer 322. For example, when one of the receiving coils experiences a magnetic field, the spacer 322 of the receiver 314 shields the other transmission coil from the magnetic field.

In some embodiments, the electronic device and/or the accessory device has a housing with non-parallel housing surfaces. Because the magnetic coupling of the transmission coil and the receiving coil is generally most efficient when closest and parallel (due to the magnetic field extending in a direction normal to the transmission coil plane), a transmission coil and/or a receiving coil may be positioned parallel to the housing surface irrespective of the orientation relative to the paired transmission coil and/or receiving coil, respectively.

In some embodiments, an accessory device has a housing that is wedge-shaped such that an upper surface is oriented at an angle to the lower surface of the accessory device. In some embodiments, the accessory device has a curved surface. In some embodiments, the accessory device has a faceted surface. In such embodiments, the receiving coils of the receiver are positioned parallel to (or substantially parallel to) the surface of the accessory device housing proximate the receiving coil. In some embodiments, the receiving coils are angled with respect to one another (e.g., to account for a wedge shape of the accessory in which they are to be mounted). In some embodiments, the receiving coils are angled so as to be parallel with the respective surfaces of the device in which they are to be mounted. Thus, as shown in FIG. 6, in some embodiments the spacer 322 has a wedge shape such that one portion of the first receiving coil 320-1 is closer to a first portion of the second receiving coil 320-2 than a second portion of the receiving coil 320-1 is to a second portion of the second receiving coil 320-2.

As shown in FIG. 6, in accordance with some embodiments, the spacer 322 of the receiver 314 has non-parallel surfaces to complement the angle between the housing surfaces and the associated angle between the first receiving coil 320-1 and second receiving coil 320-2. In some embodiments, the spacer 322 is a solid piece of magnetically shielding material with an upper surface and a lower surface that are oriented at angle relative to one another. In some embodiments, the spacer 322 includes two or more pieces of magnetically shielding material with a wedge-shaped adhesive or other material positioned therebetween. In some embodiments, the spacer 322 includes two or more uniformly-shaped magnetic materials with a non-magnetic material in-between. For example, it may reduce manufacturing costs or resources to use magnetically shielding material of uniform thickness instead of machining the angle into the magnetically shielding material. In some embodiments, the spacer 322 includes two or more magnetic materials 340 (e.g., ferrite) with a wedge of non-magnetic material 342 (e.g., zinc) therebetween.

Figure 7:
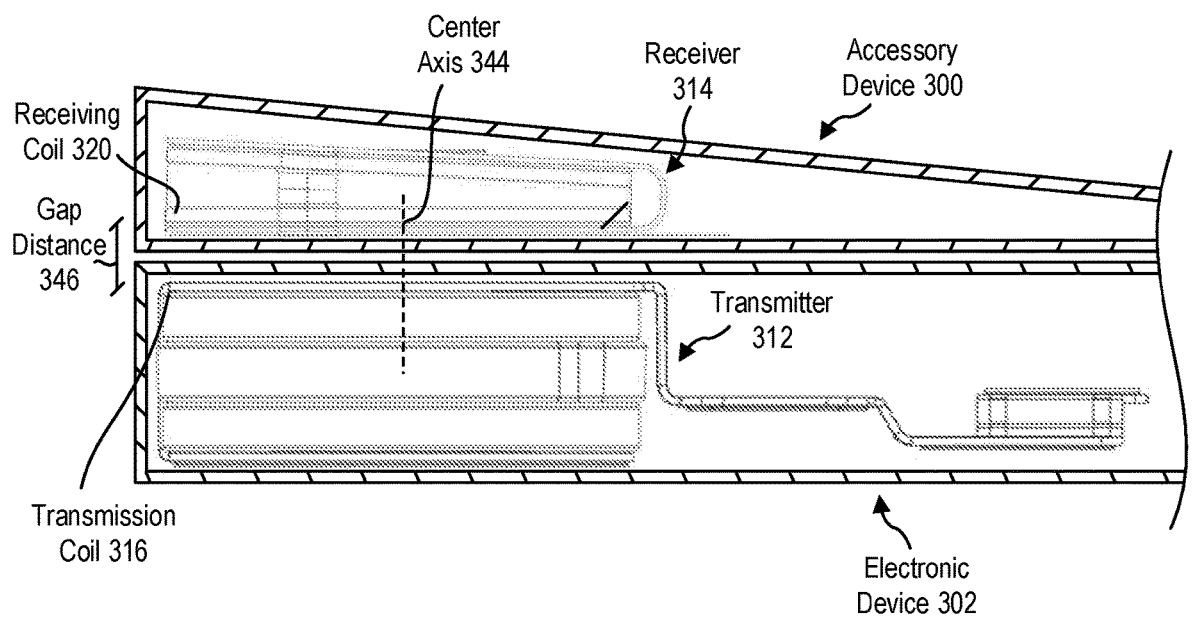
FIG. 7 is a side cross-sectional detail of a receiver and a transmitter in a first charging position, according to at least one embodiment of the present disclosure.

Efficient power transmission between a transmission coil 316 and a receiving coil 320 via magnetic fields occurs when the transmission coil 316 and the receiving coil 320 are aligned about a shared center axis 344 in parallel planes of the coils 316, 320 and the transmission coil 316 and the receiving coil 320 are in close proximity, such as shown in the example of FIG. 7. In some embodiments, the first charging position and/or second charging position of the accessory device 300 relative to the electronic device 302 aligns one of the transmission coils 316 and one of the receiving coils 320. In some embodiments, a transmission coil 316 is proximate to a receiving coil 320, and the transmission coil 316 and the receiving coil 320 are aligned when each of the transmission coil 316 and the receiving coil 320 lie in planes that are parallel to one another. In some embodiments, the transmission coil 316 and the receiving coil 320 are aligned when they share a central axis 344. In one example, the transmission coil 316 and the receiving coil 320 are aligned when they lie in planes that are parallel to one another and share a central axis 344.

The electronic device 302 provides a charging current through the transmission coil 316 proximate the accessory device 300 to generate a magnetic field to couple the coils 316, 320. In some embodiments, the charging current is in a range having an upper value, a lower value, or upper and lower values including any of 100 milliwatts (mW), 200 mW, 300 mW, 400 mW, 500 mW, 600 mW, 700 mW, 700 mW, 700 mW, 1.0 W, 2.0 W, 3.0 W, 5.0 W, 7.5 W, 10.0 W, 12.5 W, 15.0 W, or any values therebetween. In some embodiments, the charging current is greater than 100 mW. In some embodiments, the charging current is less than 15.0 W. In some embodiments, the charging current is between 100 mW and 15.0 W. In some embodiments, the charging current is between 500 mW and 10.0 W. In one example, the charging current target is 1.0 W.

The charging current generates a magnetic field as the charging current flows through the transmission coil 316. The magnetic field induces an induced current in the receiving coil 320 located within the magnetic field. In some embodiments, the induced current is in a range having an upper value, a lower value, or upper and lower values including any of 50 milliwatts (mW), 100 mW, 200 mW, 300 mW, 400 mW, 500 mW, 600 mW, 700 mW, 700 mW, 700 mW, 1.0 W, 2.0 W, 3.0 W, 5.0 W, 7.5 W, or any values therebetween. In some embodiments, the induced current is greater than 50 mW. In some embodiments, the induced current is less than 7.5 W. In some embodiments, the induced current is between 50 mW and 7.5 W. In some embodiments, the induced current is between 100 mW and 5.0 W. In one example, the induced current target is 200 mW.

The percentage of the charging current that is transmitted to the induced current is the induction efficiency of the system. In some embodiments, the induction efficiency is in a range having an upper value, a lower value, or upper and lower values including any of 5%, 10%, 15%, 20%, 25%, 30%, 35%, 40%, 45%, 50%, or any values therebetween. In some embodiments, the induction efficiency when the transmission coil is aligned with the receiving coil is greater than 5%. In some embodiments, the induction efficiency is less than 50%. In some embodiments, the induction efficiency is between 5% and 50%. In some embodiments, the induction efficiency is between 10% and 35%. In one example, the induction efficiency is 25%.

In some embodiments, a distance 346 between the transmission coil 316 and the corresponding receiving coil 320 (e.g., through a housing material, a keyset, a display glass, etc.) is in a range having an upper value, a lower value, or upper and lower values including any of 1.0 millimeters (mm), 1.5 mm, 2.0 mm, 2.5 mm, 3.0 mm, 4.0 mm, 5.0 mm, 6.0 mm, 8.0 mm, 10.0 mm, or any values therebetween. In some embodiments, the distance 346 between the transmission coil 316 and the receiving coil 320 coil is greater than 1.0 mm. In some embodiments, the distance 346 is less than 10.0 mm. In some embodiments, the distance 346 is between 1.0 mm and 10.0 mm. In some embodiments, the distance 346 is between 1.5 mm and 3.5 mm. In one example, the distance 346 is 2.0 mm.

While the transmission coils and receiving coils have been described herein as providing power from the transmission coils to the receiving coils, it should be understood that a charging current can be applied to a receiving coil to generate a magnetic field, as well. For example, when a first transmission coil receives a charging current and generates a magnetic field, the magnetic field induces an induced current in a first receiving coil proximate the first transmission coil, the induced current (or another current) can be applied to the second coil of the receiver to generate a second magnetic field away from the transmitter. The second magnetic field may further be used to power and/or charge another device. In some embodiments, a transmission coil can be positioned in a magnetic field to receive power from an external source.

Figure 8:
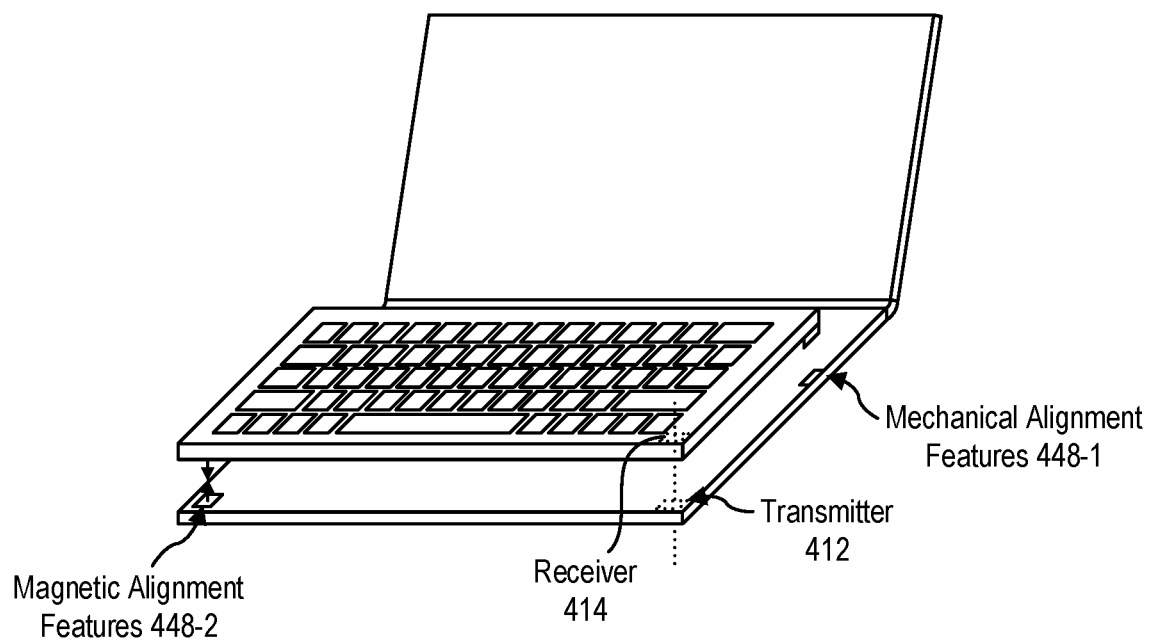
FIG. 8 is a perspective exploded view of a charging system with alignment features, according to at least one embodiment of the present disclosure.

Referring now to FIG. 8, because the induction efficiency of the charging system is based upon the alignment of the transmission coil and the receiving coil, in some embodiments, the charging system includes one or more alignment features 448 to assist a user in aligning the receiver 414 and the transmitter 412. In some embodiments, the alignment features 448 include one or more mechanical alignment features 448-1, such as an interlocking protrusion and recess, pins, holes, slots, posts or other complementary static features.

In some embodiments, the alignment features 448 include mechanical fasteners that fix the accessory device in the charging position relative to the electronic device, such as clips, clamps, bolts, or other selective fasteners that can selectively retain and release the accessory device.

As shown in FIG. 8, in some embodiments, the alignment features 448 include magnetic alignment features 448-2, such as permanent magnets and/or electromagnets positioned in one or both of the accessory device and electronic device. Magnetic alignment features can apply both an attractive force normal to the surface to hold the accessory device against the electronic device and transverse to the surface to align the accessory device in-plane with the surface of the electronic device. FIG. 8 further illustrates how different alignment features 448 can work in concert to provide both mechanical interlocks and magnetic attraction forces to assist alignment of the transmitter 412 and receiver 414.

Figure 9:
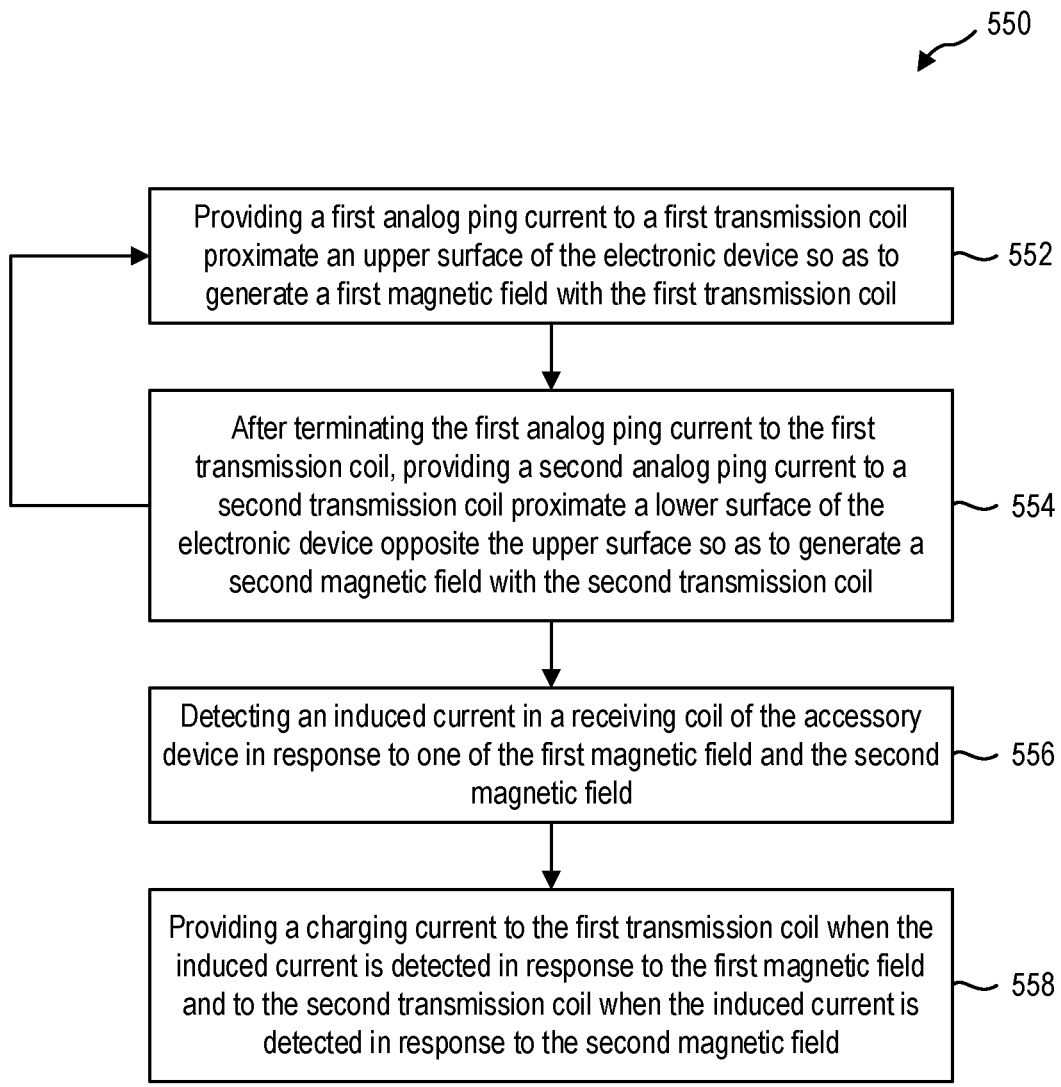
FIG. 9 is a flowchart illustrating a method of wirelessly charging an accessory device from an electronic device, according to at least one embodiment of the present disclosure.

Providing a charging current to one or both of the transmission coils at all times consumes a large amount of power and is inefficient, and may cause thermal issues for the device. FIG. 9 is a flowchart illustrating a method 550 of charging a device according to the present disclosure. In some embodiments, a method 550 of wirelessly charging an accessory device includes detecting the presence of a receiving coil proximate a one of the transmission coils and subsequently providing a charging current to that transmission coil to induce a current in the receiving coil. In some embodiments, detecting the presence of a receiving coil includes measuring a current applied to the transmission coil. The current will be constant as applied to the transmission coil unless a conductive object is positioned in the magnetic field produced by the transmission coil. When a conductive object is present in the magnetic field, the conductive object will alter the magnetic field, affecting the current in the transmission coil.

The method 550 includes providing (at 552) a first analog ping current to a first transmission coil proximate an upper surface of the electronic device so as to generate a first magnetic field with the first transmission coil, where at least a portion of the first magnetic field is above the upper surface. The method 550 then includes stopping the first analog ping current and providing (at 554) a second analog ping current to a second transmission coil proximate a lower surface of the electronic device opposite the upper surface so as to generate a second magnetic field with the second transmission coil, where at least a portion of the second magnetic field is below the lower surface.

The analog ping current applied to the transmission coil does not need to be the full charging current, because the analog ping needs only to detect the presence of a conductive material proximate the transmission coil but does not need to transmit power to the conductive material. In some embodiments, the analog ping current applied to the transmission coil (e.g., to generate an analog ping and detect a conductive material proximate the transmission coil) is less than the charging current. In some embodiments, the analog ping current is in a range having an upper value, a lower value, or upper and lower values including any of 50 milliwatts (mW), 100 mW, 200 mW, 300 mW, 400 mW, 500 mW, 600 mW, 700 mW, 700 mW, 700 mW, 1.0 W, 2.0 W, 3.0 W, 5.0 W, 7.5 W, or any values therebetween. In some embodiments, the analog ping current is greater than 50 mW. In some embodiments, the analog ping current is less than 7.5 W. In some embodiments, the analog ping current is between 50 mW and 7.5 W. In some embodiments, the analog ping current is between 100 mW and 5.0 W. In one example, the analog ping current is 125 mW.

In some embodiments, the transmitter alternates between emitting an analog ping magnetic field from the first transmission coil and emitting an analog ping magnetic field from the second transmission coil. The duration of each analog ping is in a range having an upper value, a lower value, or upper and lower values including any of 1 millisecond (1 ms), 5 ms, 10 ms, 15 ms, 20 ms, 25 ms, 50 ms, 100 ms, 250 ms, 1 second, or any value therebetween. In some embodiments, the duration of each analog ping is greater than 1 ms. In some embodiments, the duration of each analog ping is less than 1 s. In some embodiments, the duration of each analog ping is between 1 ms and 1 s. In some embodiments, the duration of each analog ping is between 5 ms and 250 ms. In some embodiments, the duration of each analog ping is 10 ms.

The analog ping and a measured change in the analog ping current detects (at 556) the presence of a conductive material in the analog ping magnetic field. In some embodiments, a subsequent communication (e.g., a digital communication, or series of magnetic field pulses and/or amplitudes) can communicate with a receiver to confirm the conductive material is a receiving coil, and not merely a metallic object, such as a metal desk surface. The subsequent communication can allow data communication with the accessory device through the receiver. For example, a near-field communication "wake up" standard can provide data communication between devices using a magnetic field.

In some embodiments, the accessory device can respond to the digital ping with a confirmation signal using a radio frequency (RF) wireless data signal to communicate with a RF transceiver and communication device of the electronic device. In some embodiments, the accessory device can respond to the digital ping with a confirmation signal using a current applied to the receiving coil (as described above) to generate a magnetic field with the receiving coil. The magnetic field can be detected by the electronic device to confirm the presence of the receiving coil.

After detecting the presence of a receiving coil proximate the transmission coil, the method includes providing (at 558) a charging current to the transmission coil to generate a charging magnetic field. In some embodiments, the charging current is applied to the first transmission coil when the induced current is detected in response to the first magnetic field and to the second transmission coil when the induced current is detected in response to the second magnetic field.

INDUSTRIAL APPLICABILITY

The present disclosure relates generally to providing power to an electronic accessory to power the electronic accessory and/or charge a battery of the electronic accessory wirelessly. In some embodiments, the power is provided to the electronic accessory by an electronic device, such as a laptop computer, a tablet computer, a hybrid computer, a smartphone, a smart television, other appliance, an automobile (such as in a passenger compartment of the automobile), or another electronic device. In some embodiments, providing power to the accessory device wirelessly includes positioning the accessory device in one of a plurality of positions relative to the electronic device.

In some embodiments, a wireless charging system includes of a set of two transmission coils and two receiving coils. The transmission and receiving coils are contained within flexible printed circuit boards (FPCs) which are folded around other mechanical parts so as to create a stack that positions the transmission and receiving coils close to the front and back surfaces of the devices in which they are contained, respectively. The mechanical parts used in the stack include adhesives and magnetic field insulating layers.

In some embodiments, a charging system includes an accessory device and an electronic device. The electronic device may be a laptop computer, a tablet computer, a hybrid computer, a smartphone, a smart television, other appliance, an automobile (such as in a passenger compartment of the automobile), or another electronic device. For example, the electronic device may be a laptop with a first portion and a second portion that are movable by a hinge. The first portion may contain a display and the second portion has at least one user input device, such as a keyboard or a touch-sensitive surface like a pressure-sensing or capacitance-sensing surface.

The accessory device may be any accessory device that is powered by electricity. In some embodiments, the accessory device is an device for use with the electronic device, such as a Bluetooth-enabled accessory that is in data communication with the electronic device. In non-limiting examples, the accessory device can be a user input device, such as a keyboard, a mouse, a touchpad, a trackball, a stylus, a presentation remote, a pointer, a gamepad, or other device that is used to interact with and/or provide inputs to the electronic device via a data connection. In a specific example, the electronic device is a laptop and the accessory device is a keyboard. In other examples, the accessory device is an audio and/or video output device in data communication with the electronic device. In another specific example, the electronic device is a smart television and the accessory device is an audio output device such as a Bluetooth-enabled speaker or headset.

In some embodiments, the accessory device is a device that operates independently from the electronic device. For example, the accessory device is a tablet computer, a hybrid computer, a smartphone, a smartwatch, a head-mounted display, another wearable device, headphones, earphones, or other devices that may function independently from the electronic device. In a specific example, the electronic device is a hybrid computer and the accessory device is a smartphone.

In some embodiments, the accessory device is chargeable from the electronic device in a first charging position and a second charging position. The first charging position is on a first surface of the electronic device and the second charging position is on an opposite second surface of the electronic device. The accessory device can receive power from the electronic device in the first charging position or the second charging position.

In some embodiments, the charging power received by the accessory device (e.g., the induced current in the receiver) is the same whether the accessory device is in the first charging position or the second charging position. In some embodiments, the charging power received by the accessory device varies whether the accessory device is in the first charging position or the second charging position. The charging power can vary depending on a distance between the transmission coil and the receiving coil, the charging current applied to the transmission coil, the size of the transmission coil, the material of the transmission coil, the size of the receiving coil, the material of the receiving coil, the in-plane alignment of the transmission coil and the receiving coil, the angular orientation of the transmission coil and the receiving coil, and other variables.

In some examples, the first charging position induces a greater induced current in the accessory device because the housing of the electronic device is thinner proximate the first surface of the electronic device than proximate the second surface of the electronic device, such that the distance between the powered transmission coil and the receiving coil is smaller in the first charging position than the second charging position. In other examples, the first charging position induces a greater induced current in the accessory device because the powered transmission coil proximate the first surface is larger than the transmission coil proximate the second surface, such that the magnetic field produced by the transmission coil proximate the first charging position is larger than the transmission coil proximate the second charging position.

In some embodiments, the transmission coils of the transmitter are spaced apart from one another to position each of the transmission coils close to the opposing surfaces of the electronic device housing. Similarly, in some embodiments, the receiving coils of the receiver are spaced apart from one another to position each of the receiving coils close to the opposing surfaces of the accessory device housing.

Because the charging power provided to the receiver is exponentially related to the proximity of the transmission coil, in some embodiments, only one of the transmission coils is powered by a charging current at a time. Powering only one transmission coil can reduce power consumption and provide more efficient power transmission. A spacer positioned between the first transmission coil and the second transmission coil can magnetically insulate the first transmission coil and the second transmission coil from one another.

In some embodiments, the spacer includes a magnetic shielding material that limits or prevents the magnetic coupling of the first transmission coil and the second transmission coil when one is powered. In some examples, the spacer includes an electrically conductive material. In other examples, the spacer includes a magnetic material. In yet other examples, the spacer includes a ferromagnetic material. In at least one embodiment, the spacer includes ferrite. In at least another embodiment, the spacer includes zinc to further prevent magnetic flux bleed beyond the ferrite or magnetic material. The charge carrier particles in the conductive material can move in the presence of the magnetic field and cancel out the magnetic field.

In some embodiments, a spacer is positioned in the receiver to space the first receiving coil and second receiving coil apart from one another. The spacer can include a magnetic shielding material that limits or prevents the magnetic coupling of the first receiving coil and the second receiving coil when one is exposed to a magnetic field from one side. In some examples, the spacer includes an electrically conductive material. In other examples, the spacer includes a magnetic material. In yet other examples, the spacer includes a ferromagnetic material. In at least one embodiment, the spacer includes ferrite. In at least another embodiment, the spacer includes zinc.

In one or both of the transmitter and the receiver, the coils can be printed on a single FPC. In some examples, the first transmission coil and second transmission are printed on a single FPC. In other examples, the first receiver coil and second receiver coil are printed on a single FPC. The coils can be supported by a flexible connector such that the two coils and a terminal are all printed on a single FPC, which can be folded upon itself to produce a "stacked" set of coils.

While each transmission coil produced a magnetic field extending away from the transmission coil in a direction normal to the plane of the coils, the spacer positioned between the two transmission coils will attenuate or stop the magnetic field in the direction of the spacer. For example, the magnetic field produced by an upper transmission coil will extend upward from the upper transmission coil and the spacer will shield the lower transmission coil (and other electronics or objects) from the associated downward portion of the magnetic field. In another example, the magnetic field produced by the lower transmission coil will extend downward from the upper transmission coil and the spacer will shield the upper transmission coil (and other electronics or objects) from the associated upward portion of the magnetic field.

In some embodiments, the first transmission coil and second transmission coil are aligned with one another. In some examples, the first transmission coil and second transmission coil are positioned with a shared center axis. In other examples, the first transmission coil and second transmission coil are parallel to one another. In yet other examples, the first transmission coil and second transmission coil have the same area. In further examples, the first transmission coil and second transmission coil have the same area, have the same shape, and share a center axis. In at least one example, the first transmission coil and second transmission coil have the same area, have the same shape, share a center axis, and are parallel such that the first transmission coil and second transmission coil are symmetrical about a mirror plane through the spacer. For example, when one of the transmission coils generates a magnetic field, the spacer will shield the other transmission coil from the magnetic field.

In some embodiments, the receiver includes a first receiving coil and a second receiving coil that are positioned opposite one another on either side of a spacer. In some embodiments, the first receiving coil and second receiving coil are aligned with one another. In some examples, the first receiving coil and second receiving coil are positioned with a shared center axis. In other examples, the first receiving coil and second receiving coil are parallel to one another. In yet other examples, the first receiving coil and second receiving coil have the same area. In further examples, the first receiving coil and second receiving coil have the same area, have the same shape, and share a center axis. In at least one example, the first receiving coil and second receiving coil have the same area, have the same shape, share a center axis, and are parallel such that the first receiving coil and second receiving coil are symmetrical about a mirror plane through the spacer. For example, when one of the receiving coils experiences a magnetic field, the spacer of the receiver will shield the other transmission coil from the magnetic field.

In some embodiments, the electronic device and/or the accessory device has a housing with non-parallel housing surfaces. Because the magnetic coupling of the transmission coil and the receiving coil is generally most efficient when closest and parallel (due to the magnetic field extending in a direction normal to the transmission coil plane), a transmission coil and/or a receiving coil may be positioned parallel to the housing surface irrespective of the orientation relative to the paired transmission coil and/or receiving coil, respectively.

In some embodiments, an accessory device has a housing that is wedge-shaped such that an upper surface is oriented at an angle to the lower surface of the accessory device. In some embodiments, the accessory device has a curved surface. In some embodiments, the accessory device has a faceted surface. In such embodiments, the receiving coils of the receiver are positioned parallel to (or substantially parallel to) the surface of the accessory device housing proximate the receiving coil.

The spacer of the receiver has non-parallel surfaces to complement the angle between the housing surfaces and the associated angle between the receiving coil. In some embodiments the spacer is a solid piece of magnetically shielding material with an upper surface and a lower surface that are oriented at angle relative to one another. In some embodiments, the spacer includes two or more pieces of magnetically shielding material with a wedge-shaped adhesive or other shim material positioned therebetween. For example, it may reduce manufacturing costs or resources to use magnetically shielding material of uniform thickness instead of machining the angle into the magnetically shielding material.

Efficient power transmission between a transmission coil and a receiving coil via magnetic fields occurs when the transmission coil and the receiving coil are aligned about a shared center axis in parallel planes of the coils and the transmission coil and the receiving coil are as close as possible. In some embodiments, the first charging position and/or second charging position of the accessory device relative to the electronic device aligns one of the transmission coils and one of the receiving coils. In some examples, a first transmission coil is proximate to a first receiving coil, and the first transmission coil and first transmission coil are aligned when each of the first transmission coil and first receiving coil lie in planes that are parallel to one another. In other examples, the first transmission coil and first receiving coil are aligned when they share a central axis. In at least one example, the first transmission coil and first receiving coil are aligned when they lie in planes that are parallel to one another and share a central axis.

The electronic device provides a charging current through the transmission coil proximate the accessory device to generate a magnetic field to couple the coils. In some embodiments, the charging current is in a range having an upper value, a lower value, or upper and lower values including any of 100 milliwatts (mW), 200 mW, 300 mW, 400 mW, 500 mW, 600 mW, 700 mW, 700 mW, 700 mW, 1.0

W, 2.0 W, 3.0 W, 5.0 W, 7.5 W, 10.0 W, 12.5 W, 15.0 W, or any values therebetween. In some examples, the charging current is greater than 100 mW. In some examples, the charging current is less than 15.0 W. In some examples, the charging current is between 100 mW and 15.0 W. In some examples, the charging current is between 500 mW and 10.0 W. In at least one example, the charging current is about 1.0 W.

The charging current generates a magnetic field as the charging current flows through the transmission coil. The magnetic field induces an induced current in the receiving coil located within the magnetic field. In some embodiments, the induced current is in a range having an upper value, a lower value, or upper and lower values including any of 50 milliwatts (mW), 100 mW, 200 mW, 300 mW, 400 mW, 500 mW, 600 mW, 700 mW, 700 mW, 700 mW, 1.0 W, 2.0 W, 3.0 W, 5.0 W, 7.5 W, or any values therebetween. In some examples, the induced current is greater than 50 mW. In some examples, the induced current is less than 7.5 W. In some examples, the induced current is between 50 mW and 7.5 W. In some examples, the induced current is between 100 mW and 5.0 W. In at least one example, the induced current is about 200 mW.

The percentage of the charging current that is transmitted to the induced current is the induction efficiency of the system. In some embodiments, the induction efficiency is in a range having an upper value, a lower value, or upper and lower values including any of 5%, 10%, 15%, 20%, 25%, 30%, 35%, 40%, 45%, 50%, or any values therebetween. In some examples, the induction efficiency when the transmission coil is aligned with the receiving coil is greater than 5%. In some examples, the induction efficiency is less than 50%. In some examples, the induction efficiency is between 5% and 50%. In some examples, the induction efficiency is between 10% and 35%. In at least one example, the induction efficiency is about 25%.

In some embodiments, a distance between the first transmission coil and first receiving coil proximate one another (e.g., through a housing material, a keyset, a display glass, etc.) is in a range having an upper value, a lower value, or upper and lower values including any of 1.0 millimeters (mm), 1.5 mm, 2.0 mm, 2.5 mm, 3.0 mm, 4.0 mm, 5.0 mm, 6.0 mm, 8.0 mm, 10.0 mm, or any values therebetween. In some examples, the distance between the first transmission coil and the second transmission coil is greater than 1.0 mm. In some examples, the distance is less than 10.0 mm. In some examples, the distance is between 1.0 mm and 10.0 mm. In some examples, the distance is between 1.5 mm and 3.5 mm. In at least one example, the distance is about 2.0 mm.

While the transmission coils and receiving coils have been described herein as providing power from the transmission coils to the receiving coils, it should be understood that a charging current can be applied to a receiving coil and generate a magnetic field, as well. For example, when a first transmission coil receives a charging current and generates a magnetic field, the magnetic field induces an induced current in a first receiving coil proximate the first transmission coil, the induced current (or another current) can be applied to the second coil of the receiver to generate a second magnetic field away from the transmitter. The second magnetic field may further be used to power and/or charge another device. In some examples, a transmission coil can be positioned in a magnetic field to receive power from an external source.

Because the induction efficiency of the charging system is based upon the alignment of the transmission coil and the receiving coil, in some embodiments, the charging system includes one or more alignment features to assist a user in aligning the receiver and the transmitter. In some embodiments, the alignment features are mechanical alignment features such as an interlocking protrusion and recess, pins, holes, slots, posts or other complementary static features. In some embodiments, the alignment features are mechanical fasteners that fix the accessory device in the charging position relative to the electronic device, such as clips, clamps, bolts, or other selective fasteners that can selectively retain and release the accessory device. In some embodiments, the alignment features include magnetic alignment features such as permanent magnets and/or electromagnets positioned in one or both of the accessory device and electronic device. Magnetic alignment features can apply both an attractive force normal to the surface to hold the accessory device against the electronic device and transverse to the surface to align the accessory device in-plane with the surface of the electronic device.

Providing a charging current to one or both of the transmission coils at all times consumes a large amount of power and is inefficient. In some embodiments, a method of wirelessly charging an accessory device includes detecting the presence of a receiving coil proximate a one of the transmission coils and subsequently providing a charging current to that transmission coil to induce a current in the receiving coil. In some examples, detecting the presence of a receiving coil includes measuring a current applied to the transmission coil. The current will be constant as applied to the transmission coil unless a conductive object is positioned in the magnetic field produced by the transmission coil. When a conductive object is present in the magnetic field, the conductive object will alter the magnetic field, affecting the current in the transmission coil.

The analog ping current applied to the transmission coil does not need to be the full charging current, because the analog ping needs only to detect the presence of a conductive material proximate the transmission coil but does not need to transmit power to the conductive material. In some embodiments, the analog ping current applied to the transmission coil (e.g., to generate an analog ping and detect a conductive material proximate the transmission coil) is less than the charging current. In some embodiments, the analog ping current is in a range having an upper value, a lower value, or upper and lower values including any of 50 milliwatts (mW), 100 mW, 200 mW, 300 mW, 400 mW, 500 mW, 600 mW, 700 mW, 700 mW, 700 mW, 1.0 W, 2.0 W, 3.0 W, 5.0 W, 7.5 W, or any values therebetween. In some embodiments, the analog ping current is greater than 50 mW. In some embodiments, the analog ping current is less than 7.5 W. In some embodiments, the analog ping current is between 50 mW and 7.5 W. In some embodiments, the analog ping current is between 100 mW and 5.0 W. In one example, the analog ping current is 125 mW.

In some embodiments, the transmitter alternates between emitting an analog ping magnetic field from the first transmission coil and emitting an analog ping magnetic field from the second transmission coil. The duration of each analog ping is in a range having an upper value, a lower value, or upper and lower values including any of 1 millisecond (1 ms), 5 ms, 10 ms, 15 ms, 20 ms, 25 ms, 50 ms, 100 ms, 250 ms, 1 second, or any value therebetween. In some embodiments, the duration of each analog ping is greater than 1 ms. In some embodiments, the duration of each analog ping is less than 1 s. In some embodiments, the duration of each analog ping is between 1 ms and 1 s. In some embodiments, the duration of each analog ping is between 5 ms and 250 ms. In some embodiments, the duration of each analog ping is 10 ms.

The analog ping and a measured change in the analog ping current detects the presence of a conductive material in the analog ping magnetic field. A subsequent digital ping, or series of magnetic field pulses and/or amplitudes, can communicate with a receiver to confirm the conductive material is a receiving coil, and not merely a metallic object, such as a metal desk surface. The digital ping can allow data communication with the accessory device through the receiver. For example, a near-field communication "wake up" standard can provide data communication between devices using a magnetic field.

In some embodiments, the accessory device can respond to the digital ping with a confirmation signal using a radio frequency (RF) wireless data signal to communicate with a RF transceiver and communication device of the electronic device. In some embodiments, the accessory device can respond to the digital ping with a confirmation signal using a current applied to the receiving coil (as described above) to generate a magnetic field with the receiving coil. The magnetic field can be detected by the electronic device to confirm the presence of the receiving coil.

After detecting the presence of a receiving coil proximate the transmission coil, the method includes providing a charging current to the transmission coil to generate a charging magnetic field. In some embodiments, the charging current is applied to the first transmission coil when the induced current is detected in response to the first magnetic field and to the second transmission coil when the induced current is detected in response to the second magnetic field.

In some embodiments, a charging system according to the present disclosure can allow an accessory device to charge through either of a first surface or an opposite second surface of the electronic device by magnetic induction between one of a plurality of transmission coils and one or a plurality of receiving coils without magnetic coupling of the transmission coils to themselves or magnetic coupling of the receiving coils to themselves. A charging system with stacked transmission coils and/or receiving coils, therefore, provides a more flexible and efficient power transmission system in a small footprint within the electronic device and accessory device.

The present disclosure relates to systems and methods for wirelessly charging an accessory device using a magnetic field from an electronic device according to at least the examples provided in the sections below:

1. A device for inductively charging an electronic accessory, the device comprising:
   a first portion (324; FIG. 4) including a first transmission coil (316-1; FIG. 4) in a first plane, the first transmission coil configured to generate a first magnetic field (332-1; FIG. 5-1);
   a second portion (326; FIG. 4) including a second transmission coil (316-2; FIG. 4) in a second plane, the second transmission coil configured to generate a second magnetic field (332-2; FIG. 5-2); and
   a spacer (318; FIG. 4) positioned between the first transmission coil and the second transmission coil and between the first plane and the second plane, the spacer material magnetically insulating the second transmission coil from the first magnetic field.
2. The device of section 1, wherein the first transmission coil and second transmission coil are aligned along a center axis (338; FIG. 5-2).
3. The device of section 2, wherein the first transmission coil (316-1; FIG. 3) has a first area and the second transmission coil (316-2; FIG. 3) has a second area, the first area and second area being the same.
4. The device of any of sections 1-3, wherein the spacer (318; FIG. 4) includes a ferromagnetic material.
5. The device of any of sections 1-4, wherein the spacer (318; FIG. 4) includes a non-magnetic material.
6. The device of any of sections 1-5, wherein the first portion (324; FIG. 3) and second portion (326; FIG. 3) are connected by a flexible connector (328; FIG. 3).
7. The device of section 6, further comprising a terminal (330; FIG. 3) in electrical communication with the first transmission coil and second transmission wherein the terminal is in electrical communication with the first transmission coil through the flexible connector.
8. The device of any of sections 1-7, wherein the first transmission coil (316-1; FIG. 3) and second transmission coil (316-2; FIG. 3) are each part of a flexible printed circuit.
9. A system for providing power to an accessory device from an electronic device, the system comprising:
   a transmitter (312; FIG. 7) including:
      a first portion including a first transmission coil (316-1; FIG. 4) configured to generate a first magnetic field,
      a second portion including a second transmission coil (316-4; FIG. 3) configured to generate a second magnetic field, and
      a transmitter spacer (318; FIG. 4) positioned between the first transmission coil (316-4; FIG. 3) and the second transmission coil (316-1; FIG. 4), the spacer material magnetically insulating the second transmission coil from the first magnetic field; and
   a receiver (314; FIG. 7) including:
      a first portion including a first receiving coil (320-1; FIG. 6) configured to generate an electrical current when exposed to a magnetic field,
      a second portion including a second receiving coil (320-2; FIG. 6) configured to generate an electrical current when exposed to a magnetic field, and
      a receiver spacer (322; FIG. 6) positioned between the first receiving coil and the second receiving coil, the spacer material magnetically insulating the first receiving coil and the second receiving coil.
10. The system of section 9, wherein the receiver spacer (322; FIG. 6) is tapered so as to orient the first receiving coil at a non-zero angle relative to the second receiving coil.
11. The system of section 9 or 10, wherein the receiver spacer (322; FIG. 6) includes a ferromagnetic material.
12. The system of any of sections 9-11, wherein the receiver spacer (322; FIG. 6) includes a non-magnetic material (342; FIG. 6).
13. The system of any of sections 9-12, wherein a charging current applied to the transmitter induces an induced current in the receiver of at least 15% of the charging current when one of the first transmission coil and second transmission coil are aligned with one of the first receiving coil and the second receiving coil.
14. A method of providing power to an accessory device from an electronic device, the method comprising:
   at the electronic device:
      providing (552; FIG. 9) a first ping current to a first transmission coil proximate a first surface of the electronic device so as to generate a first magnetic field with the first transmission coil, where a portion of the first magnetic field extends beyond the first surface;

after terminating the first ping current to the first transmission coil, providing (554; FIG. 9) a second ping current to a second transmission coil proximate a second surface of the electronic device opposite the first surface so as to generate a second magnetic field with the second transmission coil, where a portion of the second magnetic field extends beyond the second surface;

detecting (556; FIG. 9) an induced current in a receiving coil of the accessory device in response to one of the first magnetic field and the second magnetic field; and selectively providing (558; FIG. 9) a charging current to the first transmission coil when the induced current is detected in response to the first magnetic field, or to the second transmission coil when the induced current is detected in response to the second magnetic field.

15. The method of section 14, wherein detecting the induced current includes detecting a change in a transmission current of the one of the first magnetic coil and the second magnetic coil while the first magnetic field or second magnetic field is applied to the receiving coil.

16. The method of section 14 or 15 further comprising:
providing a communication signal to the one of the first magnetic coil and the second magnetic coil after detecting the induced current to generate a corresponding magnetic field; and receiving a confirmation signal from the accessory device in response to the corresponding magnetic field.

17. The method of any of sections 14-16, wherein detecting the induced current includes receiving a wireless data signal from the accessory device after the accessory device measures the induced current in the receiving coil.

18. The method of any of sections 14-17, wherein providing the charging current comprises providing a charging current in a range of 1 Watt (W) to 15 W.

19. The method of any of sections 14-18, wherein the first ping current and the second ping current are each less than the charging current.

20. The method of any of sections 14-19 further comprising aligning the first transmission coil or the second transmission coil with the receiving coil using an alignment feature of the electronic device.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A device for inductively charging an electronic accessory, the device comprising:
a first portion including a first transmission coil in a first plane, the first transmission coil configured to generate a first magnetic field;
a second portion including a second transmission coil in a second plane, the second plane being different from the first plane, the second transmission coil configured to generate a second magnetic field; and
a spacer positioned between the first transmission coil and the second transmission coil and between the first plane and the second plane, the spacer material magnetically insulating the second transmission coil from the first magnetic field.

2. The device of claim 1, wherein the first transmission coil and second transmission coil are aligned along a center axis.

3. The device of claim 2, wherein the first transmission coil has a first area and the second transmission coil has a second area, the first area and second area being the same.

4. The device of claim 1, wherein the spacer includes a ferromagnetic material.

5. The device of claim 1, wherein the spacer includes a non-magnetic material.

6. The device of claim 1, wherein the first portion and second portion are connected by a flexible connector.

7. The device of claim 6, further comprising a terminal in electrical communication with the first transmission coil and second transmission wherein the terminal is in electrical communication with the first transmission coil through the flexible connector.

8. The device of claim 1, wherein the first transmission coil and second transmission coil are each part of a flexible printed circuit.

9. A system for providing power to an accessory device from an electronic device, the system comprising:
   a transmitter including:
      a first portion including a first transmission coil configured to generate a first magnetic field,
      a second portion including a second transmission coil configured to generate a second magnetic field, and
      a spacer positioned between the first transmission coil and the second transmission coil, the spacer material magnetically insulating the second transmission coil from the first magnetic field; and
   a receiver including:
      a first portion including a first receiving coil configured to generate an electrical current when exposed to a magnetic field,
      a second portion including a second receiving coil configured to generate an electrical current when exposed to a magnetic field, and
      a receiver spacer positioned between the first receiving coil and the second receiving coil, the spacer material magnetically insulating the first receiving coil and the second receiving coil.

10. The system of claim 9, wherein the receiver spacer is tapered so as to orient the first receiving coil at a non-zero angle relative to the second receiving coil.

11. The system of claim 9, wherein the receiver spacer includes a ferromagnetic material.

12. The system of claim 9, wherein the receiver spacer includes a non-magnetic material.

13. The system of claim 9, wherein a charging current applied to the transmitter induces an induced current in the receiver of at least 15% of the charging current when one of the first transmission coil and second transmission coil are aligned with one of the first receiving coil and the second receiving coil.

* * * * *